United States Patent [19]

Dodson

[11] 4,186,273
[45] Jan. 29, 1980

[54] STEREOPHONIC SYSTEM HAVING POWER AMPLIFIERS AND SPEAKERS IN A BRIDGE CIRCUIT WITH CAPACITOR CONNECTING JUNCTION OF SPEAKERS TO COMMON TERMINAL

[75] Inventor: George B. Dodson, Framingham, Mass.

[73] Assignee: Bose Corporation, Framingham, Mass.

[21] Appl. No.: 912,323

[22] Filed: Jun. 5, 1978

[51] Int. Cl.² ............................................. H04R 5/04
[52] U.S. Cl. .................................. 179/1 G; 179/1 VE
[58] Field of Search ................ 179/1 G, 1 GB, 1 VE, 179/1 GP, 100.4 ST

[56] References Cited
U.S. PATENT DOCUMENTS 3,394,227  7/1968  Hopengarten et al. ............. 179/1 G
3,435,144  3/1969  Csicsatka ............................ 179/1 G
3,944,941  3/1976  Tsuda ................................. 179/1 G Primary Examiner—Douglas W. Olms
Attorney, Agent, or Firm—Charles Hieken

[57] ABSTRACT

Left and right stereo power amplifiers receive power from the 12-volt D.C. automobile supply bypassed by a single capacitor for both amplifiers and energize left and right loudspeakers in series with the junction of the series-connected speakers coupled to ground through a capacitor that allows the left and right speakers to be independently driven by the left and right power amplifiers, respectively, by spectral components above the crossover frequency determined by the speaker impedance and the capacitor impedance. Each power amplifier is driven by an equalizing circuit including a photocell illuminated by an LED that is driven by a feedback signal from the power amplifier.

4 Claims, 4 Drawing Figures

STEREOPHONIC SYSTEM HAVING POWER AMPLIFIERS AND SPEAKERS IN A BRIDGE CIRCUIT WITH CAPACITOR CONNECTING JUNCTION OF SPEAKERS TO COMMON TERMINAL

BACKGROUND OF THE INVENTION

The present invention relates in general to equalizing and amplifying and more particularly concerns novel apparatus and techniques for providing stereo power amplification especially useful for an automobile at high power levels with relatively low cost through novel circuitry techniques including novel dynamic equalization that alters the equalization characteristic in those frequency ranges where a present signal spectral component may cause overloading while maintaining the equalization in other frequency ranges.

It is common practice to energize stereo power amplifiers in an automobile directly from the 12-volt D.C. supply. To prevent D.C. from biasing the loudspeaker diaphragms offcenter, these amplifiers typically require a costly large capacitance connected between each power amplifier channel and a respective loudspeaker. And if equalization is used, the amplifier may be overloaded when receiving a spectral component that is appreciably boosted by the equalization circuit, thereby producing undesirable audible distortion or limiting the sound power output of the system.

Accordingly, it is an important object of this invention to provide improved amplifying and/or equalization.

It is another object of the invention to achieve one or more of the preceding objects while increasing the ratio of power output without audible distortion to cost.

It is a further object of the invention to achieve one or more of the preceding objects while providing equalization.

It is still a further object of the invention to achieve one or more of the preceding objects while reducing capacitor bulk and cost.

It is a further object of the invention to achieve one or more of the preceding objects with dynamic equalization that maintains a desired equalization contour except in those portions of the frequency range where spectral components then being amplified would produce audible overloading.

SUMMARY OF THE INVENTION

According to one aspect of the invention, in a system having first and second loudspeakers energized by left and right power amplifying means, the improvement comprises connecting the first and second loudspeakers in series between the first and second power amplifying means and capacitive means connected between a reference or ground terminal and the junction of the first and second loudspeakers for blocking D.C. from both loudspeakers. Preferably, the first and second power amplifying means coact with the loudspeakers to form a bridge at low frequencies with the loudspeakers driven by the sum of the signals provided by the first and second power amplifying means while being driven with respective signals from the first and second power amplifying means above a predetermined crossover frequency related to the capacitance and loudspeaker impedance.

According to another feature of the invention, in active equalization means there is means responsive to a signal provided by the power amplifying means representative of the output signal thereof for altering the gain of the active equalizing means in selected portions of the frequency range where gain is highest when amplifying at relatively low levels to provide substantially the same equalization in other frequency ranges while avoiding audible distortion caused by amplifier clipping when amplifying to provide relatively high sound levels. According to a specific aspect of this feature, photosensitive resistive means is coupled to a frequency sensitive network and illuminated by a light source, such as an LED, that provides light of intensity related to that of a feedback signal from the power amplifier.

Numerous other features, objects and advantages of the invention will become apparent from the following specification when read in connection with the accompanying drawing in which:

DETAILED DESCRIPTION OF PREFERRED EMBODIMENTS

Figure 1:
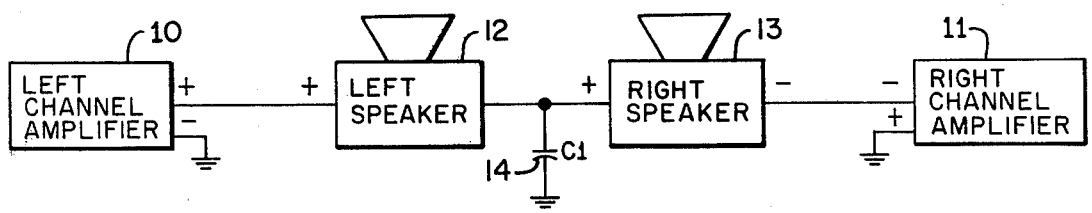
FIG. 1 is a block diagram illustrating the logical arrangement of a power amplifying system according to the invention.

With reference now to the drawing and more particularly FIG. 1 thereof, there is shown a block diagram illustrating the logical arrangement of a system according to the invention for eliminating one output coupling capacitor while the remaining coupling capacitor performs the D.C. blocking function and is of much smaller value and hence size and cost than either of the two blocking capacitors normally used in a conventional system. The system comprises left and right channel amplifiers 10 and 11, respectively, connected to left and right loudspeakers 12 and 13 in series with + and − outputs of left channel and right channel amplifiers 10 and 11, respectively, the other output terminal of each amplifier being grounded as shown. A blocking capacitor 14 is connected between the junction of left speaker 12 and right speaker 13 and ground. The left and right loudspeakers 12 and 13 are of substantially the same impedance and the left and right channel amplifiers 10 and 11 are substantially identical so that in the absence of an input signal, no D.C. flows through either loudspeaker, and the voice coil remains centered in the air gap. Upon the occurrence of a low frequency signal below the cutoff frequency, capacitor 14 is effectively an open circuit so that as the magnitude of the potential on the ungrounded output terminals of left channel and right channel amplifiers 10 and 11 increases, current flows through the series connected left and right speakers 12 and 13 to move their diaphragms in phase and provide the low frequency signals effectively monophonically. Since low frequency signals are essentially nondirectional and do not appreciably contribute to the stereo effect, this circuit arrangement provides no audible alteration in the stereo image perceived by a listener. Thus, the output signals provided by the left and right amplifiers 10 and 11, respectively, are oppositely phased to drive the series-connected left and right speakers 12 and 13, respectively, in phase at low frequencies.

At higher frequencies, capacitor 14 effectively grounds the junction of left speaker 12 and right speaker 13 so they are effectively independently driven at the higher frequencies to provide the left and right signals used by the listener to perceive the stereo image. The crossover frequency where the response is 3 db down from the range above the crossover frequency where the response is substantially uniform corresponds substantially to a frequency where the capacitive reactance of half the capacitance of capacitor 14 equals the impedance of a loudspeaker 12 or 13. For a crossover frequency of 600 Hz and speakers having an impedance of 0.5 ohms (typically achieved by having a front and rear speaker of 1 ohm for each channel connected in parallel) the value of capacitor 14 is 1000 MFD, one tenth the value of the two blocking capacitors typically used in a conventional system.

Figure 2:
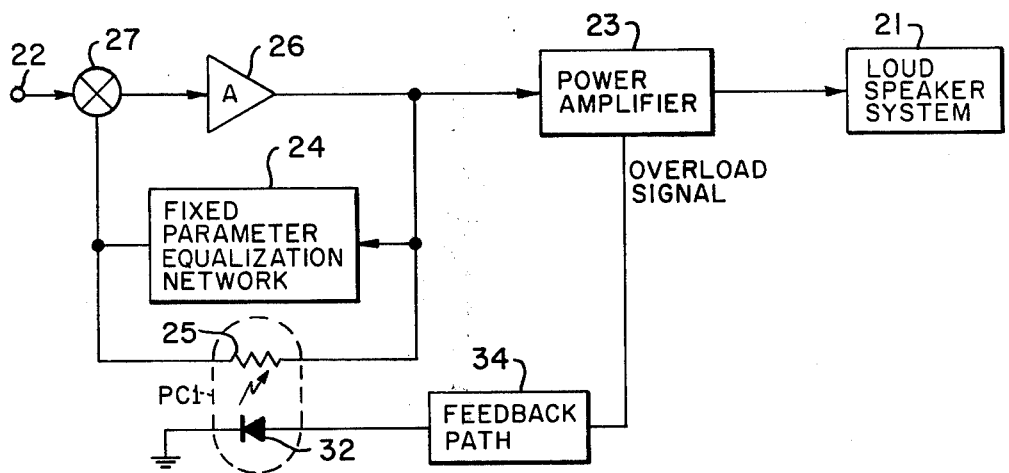
FIG. 2 is a combined block-schematic diagram illustrating the logical arrangement of dynamic equalization according to the invention.

Referring to FIG. 2, there is shown a block diagram illustrating the logical arrangement of a dynamically equalized loudspeaker system according to the invention. A loudspeaker system 21 reproduces the input signal on input terminal 22 at relatively high sound levels without audible distortion arising from overload of power amplifier 23. Input terminal 22 comprises an operational amplifier with a fixed parameter equalization network 24 shunted by a variable parameter element 25 in the feedback path from the output of amplifier 26 to summing junction 27. Power amplifier 23 delivers a feedback signal through feedback path 34 to LED 32 to illuminate photoelectric transducer 25 with light of intensity proportional to the signal amplitude of the feedback signal provided by power amplifier 23.

Having briefly described the physical arrangement of a system according to the invention, the principles of operation will now be described. In an equalized loudspeaker system the power amplifier usually overloads in response to signal spectral components in the frequency range where equalization gain is highest, usually in the bass and treble regions. A typical prior art approach incorporates a static equalizer cascaded with a compressor that uniformly reduces the gain in the transmission channel independently of frequency as signal level increases regardless of the spectral components responsible for producing the overload. Consider the situation where a vocalist is accompanied by a bass drum. The bass drum signals might well overload the system in the absence of compression. To prevent overloading, the prior art compressor reduces the gain of the channel, reducing not only the loudness of the bass drum, but also that of the vocalist. The present invention reduces the level of the bass drum to prevent the amplifier from overloading while the perceived sound level of the vocalist remains essentially the same.

The invention achieves this result with the system of FIG. 2. Maximum equalized gain occurs at those frequencies where the conductance of the feedback network around amplifier 26 is a minimum. Photoelectric transducer 25 has negligible conductance when dark, and the equalization is then determined by fixed equalization network 24. When LED 32 is energized in response to power amplifier 23 overloading, the conductance of photoelectric transducer 25 increases sufficiently to reduce the equalization gain until overloading stops. In the limit of attempting to severely overload the system, the conductance of phototransducing means 25 becomes so high compared to that of fixed equalization network 24 that the frequency response of the channel becomes essentially uniform and the system acts as an amplifier with uniform response and a compressor.

Figure 3:
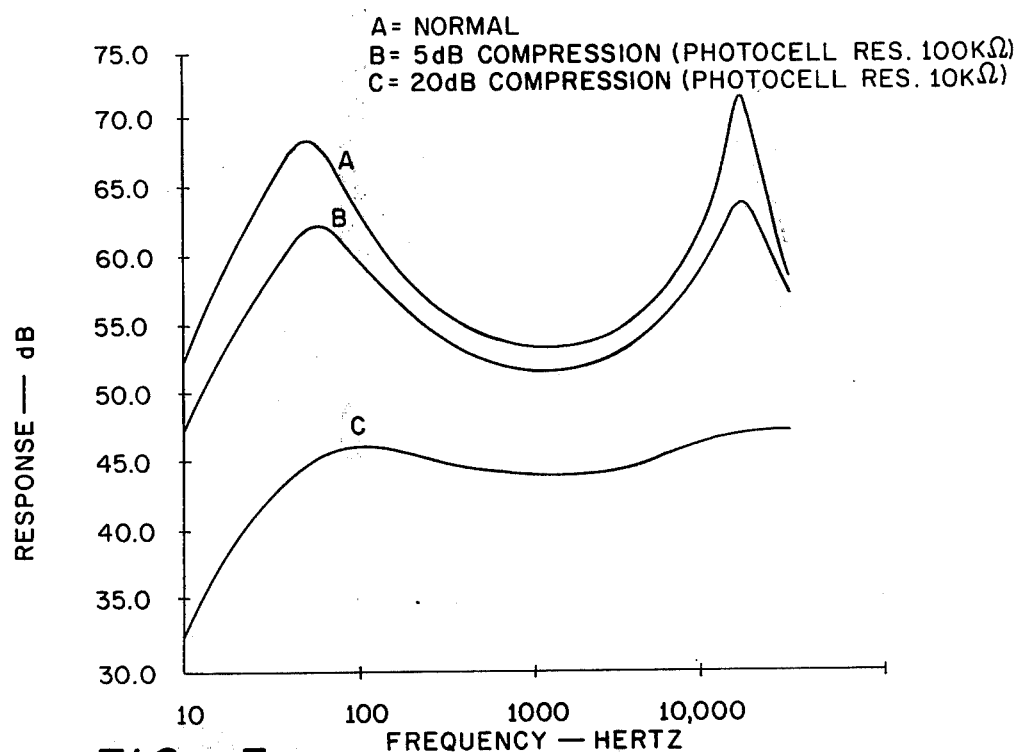
FIG. 3 is a graphical representation of equalization responses for various compressions.

Referring to FIG. 3, there is shown a graphical representation of equalizer responses for compressions of 0, 5 db and 20 db represented by curves A, B and C, respectively. Note that curve B for 5 db compression with the resistance of photoelectric transducing means 25 at 100 K ohms is only about a decibel below the uncompressed response of curve A from 200 Hz to 8,000 Hz while being down 6 db at 50 Hz and 8 db at 15 kHz. At 20 db compression for curve C with the resistance of photoelectric transducer 24 10 K ohms the frequency response is substantially uniform from 50 to 15,000 Hz.

Figure 4:
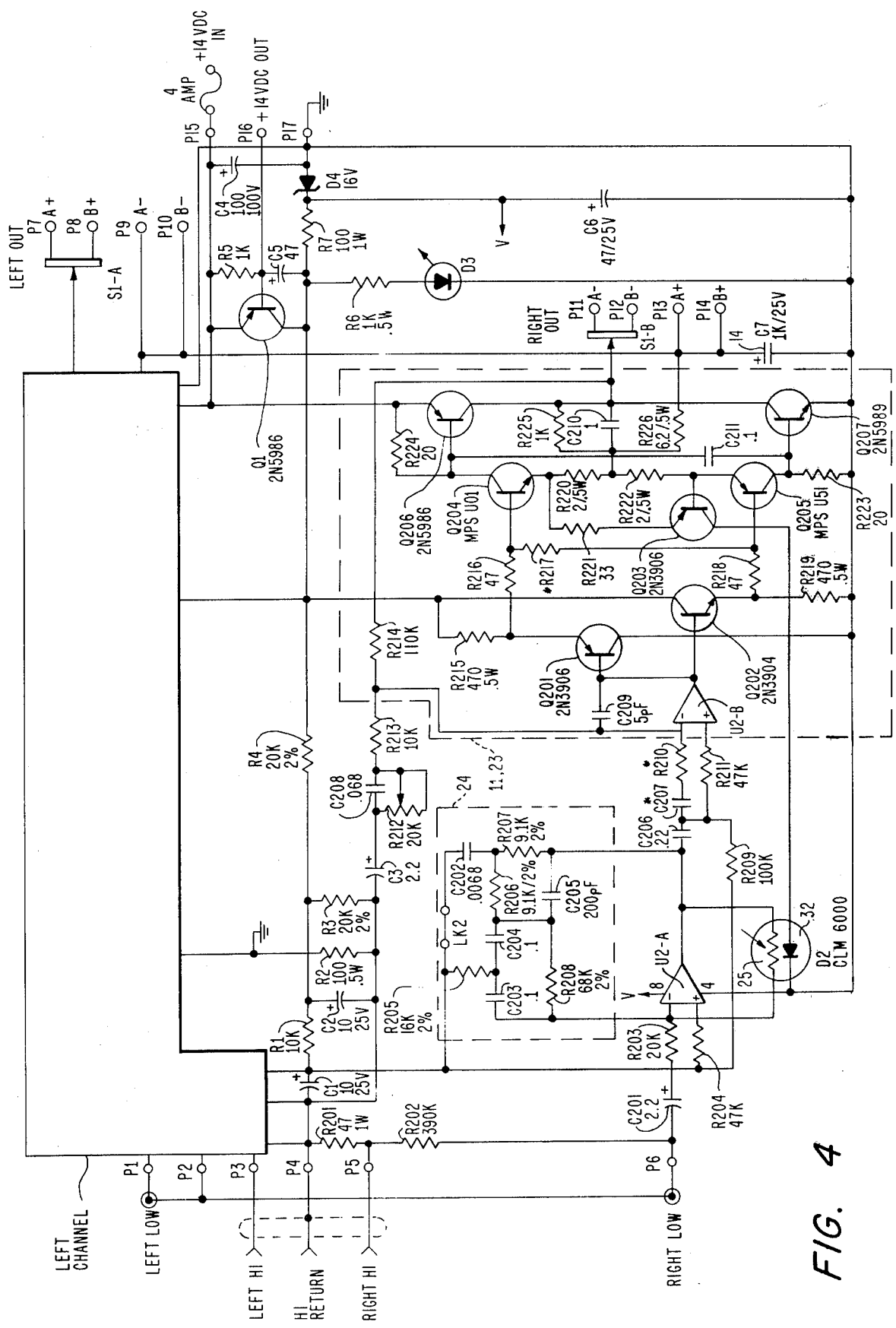
FIG. 4 is a combined block-schematic circuit diagram of a preferred embodiment of the invention.

With reference to FIG. 4, there is shown a combined block-schematic circuit diagram of a preferred embodiment of the invention with specific parameter values set forth. Since those skilled in the art will be able to practice the invention by building the circuit there set forth, the following discussion will be limited to certain features helpful in understanding the principles of operation.

Corresponding elements are identified by corresponding reference symbols throughout the drawing.

Transistor Q1 and associated circuitry comprise means for providing appropriate D.C. potentials to the circuits. Terminal P16 is normally connected to a program source, such as an associated automobile radio tuner so that turning the source on draws current through normally nonconductive transistor Q1 to provide appropriate energizing potentials to the various circuits while helping to keep the potential on the collector of transistor Q1 from exceeding the 16 volts established by Zener diode D4. The left and right channels are identical so only the right channel is shown in detail.

Transistor Q203 is normally nonconductive except when the power amplifier overloads. It then conducts to draw current through LED 32 and illuminate photoelectric transducer 25 in proportion to the degree of overloading.

The specific output circuit connections shown are for accommodating a front or A loudspeaker and a rear or B loudspeaker, these left and right pairs of loudspeakers being connected in parallel. The plus terminals of the left channel loudspeaker drivers are connected to the connected-together collectors of the output transistors while the − terminals of the right loudspeakers are connected to the connected-together collectors of the output transistors Q206 and Q207. The − terminals of the left loudspeakers and the + terminals of the right loudspeakers are connected together and to capacitor 14, typically 1,000 MFD as shown to establish a half power crossover frequency of 600 Hz for pairs of 1-ohm loudspeakers connected in parallel presenting an impedance of substantially 0.5 ohms. A preferred form of loudspeaker driver is substantially of the type used in the BOSE 901 series III loudspeaker system and described in U.S. Pat. No. 4,061,890 granted Dec. 6, 1977, to Bose Corporation on an invention of Thomas A. Froeschle entitled ELECTROACOUSTICAL TRANSDUCER. There are high inputs for high level sources, such as a tuner, and low inputs for low level inputs, such as a tape head.

There has been described novel apparatus and techniques for providing high acoustical power outputs with relatively inexpensive compact circuitry. The circuitry eliminates multi output coupling capacitors and allows the amplifier to operate near its maximum when demanded for a wide variety of program material with nearly inaudible distortion and maintaining good balance among the different sounds reproduced. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. In a stereo power amplifying system having a common terminal, first and second loudspeaker means for providing first and second sound signals representative of first and second audio input signals representative of first and second audio input signals and first and second power amplifying means for amplifying the first and second audio input signals respectively, the improvement comprising, means intercoupling said first and second loudspeaker means in series between said first and second power amplifying means, and capacitive means connected between said common terminal and the junction of said first and second loudspeaker means for blocking D.C. while allowing spectral components representative of said first and second audio input signals to pass through said capacitive means to said common terminal through said first and second loudspeaker means respectively above a predetermined crossover frequency determined by the value of said capacitive means and the impedance of said first and second loudspeaker means while preventing D.C. from flowing through said first and second loudspeaker means, said first and second loudspeaker means being intercoupled for radiating acoustical energy in phase of spectral components present in said first and second audio input signals in a frequency range below said crossover frequency in which frequency range the signals provided by said first and second power amplifying means are in phase opposition.

2. The improvement in accordance with claim 1 wherein said first and second loudspeaker means are direct coupled between said first and second power amplifying means, and the source of electrical power for said system comprises terminals for direct connection to the D.C. supply of a vehicle and means for direct coupling said D.C. supply to said system.

3. The improvement in accordance with claim 2 wherein the D.C. impedance presented by each of said loudspeaker means is of the order of one ohm or less and said capacitive means coacts with said first and second loudspeaker means to establish said crossover frequency substantially at 600 Hz.

4. The improvement in accordance with claim 3 wherein the value of said capacitance is substantially 1000 microfarads.

* * * * *